United States Patent
Lee

(10) Patent No.: US 7,701,370 B2
(45) Date of Patent: Apr. 20, 2010

(54) CURRENT OUTPUT CIRCUIT WITH BIAS CONTROL AND METHOD THEREOF

(75) Inventor: Ming-Han Lee, Sindian (TW)

(73) Assignee: Realtek Semiconductor Corp., Hsinchu (TW)

( * ) Notice: Subject to any disclaimer, the term of this patent is extended or adjusted under 35 U.S.C. 154(b) by 13 days.

(21) Appl. No.: 12/123,575

(22) Filed: May 20, 2008

(65) Prior Publication Data
US 2008/0291068 A1 Nov. 27, 2008

(30) Foreign Application Priority Data
May 21, 2007 (TW) .............................. 96118081 A

(51) Int. Cl.
*H03M 1/00* (2006.01)
(52) U.S. Cl. .................. 341/135; 341/136; 341/144
(58) Field of Classification Search ............... 341/135, 341/136, 144

See application file for complete search history.

(56) References Cited

U.S. PATENT DOCUMENTS

| 5,646,518 | A | * | 7/1997 | Lakshmikumar et al. ..... 323/316 |
| 5,798,723 | A | * | 8/1998 | Fong ........................... 341/136 |
| 7,362,249 | B2 | * | 4/2008 | Kim et al. .................... 341/139 |
| 7,446,683 | B2 | * | 11/2008 | Perner ........................ 341/135 |
| 2006/0202763 | A1 | | 9/2006 | Niki et al. |

* cited by examiner

*Primary Examiner*—Khai M Nguyen
(74) *Attorney, Agent, or Firm*—Thomas, Kayden, Horstemeyer, Risley

(57) ABSTRACT

A current output circuit with bias control and a method thereof are provided. The current output circuit includes a current mirror circuit comprising a first transistor and a second transistor having respectively two drains, and a control circuit coupled to the current mirror circuit. The control circuit receives drain voltages of the first transistor and the second transistor, and adjusts a respective gate bias of the first transistor and the second transistor according to a respective drain voltage thereof.

9 Claims, 5 Drawing Sheets

CURRENT OUTPUT CIRCUIT WITH BIAS CONTROL AND METHOD THEREOF

FIELD OF THE INVENTION

The present invention is related to a current output circuit, and more particularly to a current output circuit with bias control.

BACKGROUND OF THE INVENTION

A digital-to-analog-converter (DAC) generates an analog signal (voltage or current type) in response to a digital data. The DAC can be applied in many applications such as communication interface, Ethernet PHY, xDSL controller). Please refer to FIG. 1, showing a sample of a conventional DAC. The conventional DAC 10 comprises a plurality of DAC units 11, 12, ... and 1n. Each DAC unit 11, 12, ... , in comprises a switch 111, 121, ... , 1n1 and a current source 113, 123, ... , 1n3. The switch 111 (121, ... , 1n1) can be implemented by a pair of transistors (1111, 1113) ((1211, 1213), ... , (1n11, 1n13)). Each of the current sources 113, 123, ... , and 1n3 is implemented by a respective transistor. The respective gate of the pair of transistors 1111, 1113, 1211, 1213, ... , 1n11, 1n13 of each DAC unit 11, 12, ... , 1n receives a digital signal $D_{1+}$, $D_{1-}$, $D_{2+}$, $D_{2-}$, ... , $D_{n+}$, $D_{n-}$, provides analog currents to a load (not shown in FIG. 1) between PAD1 and PAD2 according to the digital signal, and produces an output signal $V_{out}$ between PAD1 and PAD2.

With the development of the semiconductor process, the operational adapted is gradually decreasing, and it is more and more difficult to fulfill the requirement for many specifications such as 802.3. For example, an amplitude of the transmission signal is 5V for the 10M transmission mode of the Ethernet. Please refer to FIG. 2, showing a circuit diagram of a conventional Current Steering DAC. The DAC 20 comprises a plurality of DAC units 11, 12, ... and 1n (the diagram only shows one DAC unit 11), and an impedance 13 comprising a first matching impedance Z1 and a second matching impedance Z2.

When the DAC 20 is implemented with a 0.18 µm CMOS Process, the operational voltage $V_{DD}$ is 1.8V. Please refer to FIG. 2 again, wherein the single-side amplitude peak value of the first analog signal $V_{out}$ is 1.25V, and there is only 0.55V (1.8-1.25) at two terminals of the DAC unit 11 when the voltage between the first pad PAD1 and the second pad PAD2 reaches the peak value. Therefore, it is possible to affect the working voltage of the current source 113 (implemented by a transistor 113) of the DAC unit 11, and make the operational point of the transistor 113 enter a triode region, which results in a reduced current and a decreased amplitude of the DAC unit 11. The mentioned phenomenon will be more serious if the operational voltage $V_{DD}$ is even lower.

The conventional solution is to increase the area of the transistor 113 for decreasing the saturation drain-source voltage ($V_{DS,SAT}$) thereof, which makes the operational point of the transistor 113 difficult to enter the triode region. However, the mentioned solution will increase the whole area of the circuit, and thus increase the cost as well as decrease the competitive ability accordingly.

In order to overcome the drawbacks in the prior art, a current output circuit with bias control and a method thereof are provided in the present invention.

SUMMARY OF THE INVENTION

The object of the present invention is to provide a current output circuit with bias control and a method thereof. The current output circuit of the present invention can be operated steadily and without distortion under a low operational voltage.

In an embodiment according to the present invention, a current output circuit is provided, comprising a reference current source for providing a reference current, a current mirror circuit comprising a first transistor and a second transistor, wherein the drain of the second transistor outputs an output current corresponding to the reference current, and a control circuit, coupled to the current mirror circuit and the reference current source, receiving drain voltages of the first transistor and the second transistor and adjusting a respective gate bias of the first transistor and the second transistor according to a respective drain voltage thereof.

In another embodiment according to the present invention, an apparatus is provided, comprising a converter comprising an output node and a plurality of converting units, wherein each of the converting units comprises a controlled current sourcing unit to receive a control voltage and to provide a controlled current according to the control voltage, and a switch coupled to the controlled current sourcing unit to provide the controlled current to the output node according to a digital signal. The apparatus further comprises a control circuit coupled to the converter to monitor a potential of the controlled current sourcing unit and thereby produce the control voltage.

In another embodiment according to the present invention, a current outputting method is described, comprising providing a reference current, using a current mirror circuit comprising a first transistor and a second transistor to output an output current, wherein the output current is corresponding to the reference current. The outputting method further comprises the steps of comparing a drain voltage of the first transistor with a drain voltage of the second transistor for obtaining a comparison result, and adjusting a respective gate potential of the first transistor and the second transistor according to the first comparison result.

In another embodiment according to the present invention, a digital-to-analog converter (DAC) is provided, comprising a first DAC unit responsive to a first control signal for generating a first signal, a second DAC unit responsive to a second control signal for generating a second signal, a summing circuit responsive to said first and second signals for providing an analog output, and a control circuit for monitoring a potential of one of the first and second DAC units to output a control signal to control the first and second DAC units.

In another embodiment according to the present invention, a method for converting a digital signal to an analog signal, comprising monitoring a first potential of a first digital-to-analog converter (DAC) unit to produce a control voltage, adjusting the first DAC unit and a second DAC unit in response to the control voltage, utilizing the first DAC unit to convert a digital signal into a first analog signal in response to a first control signal, utilizing the second DAC unit to convert a digital signal to a second analog signal in response to a second control signal, and summing the first and second analog signals for providing an analog output.

The present invention may best be understood through the following descriptions with reference to the accompanying drawings, wherein:

DETAILED DESCRIPTION OF THE PREFERRED EMBODIMENT

Figure 1:
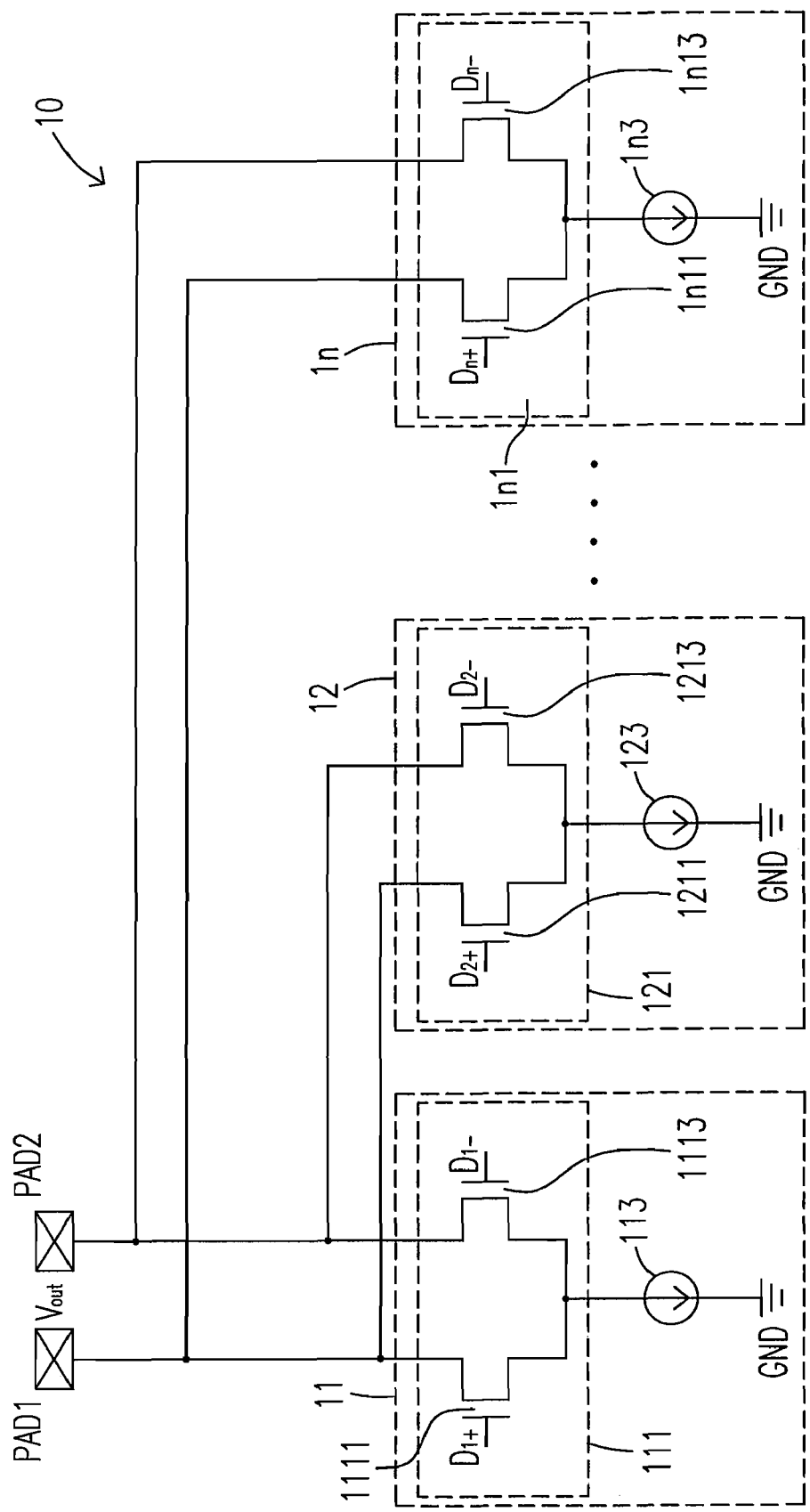
FIG. 1 is a diagram showing a conventional DAC comprising a plurality of digital to analog converting units.
Figure 2:
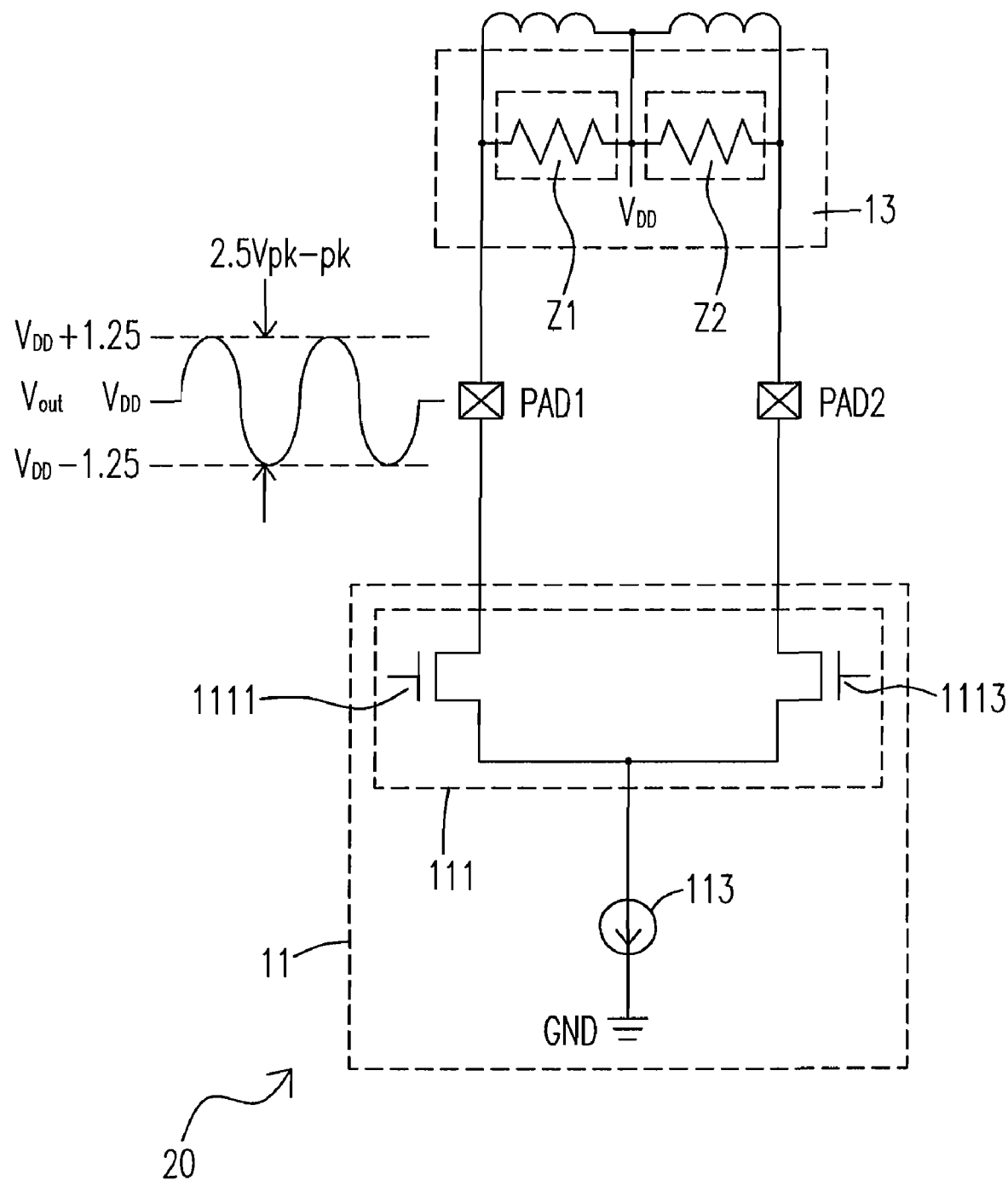
FIG. 2 is a circuit diagram of a conventional Current Steering DAC.
Figure 3:
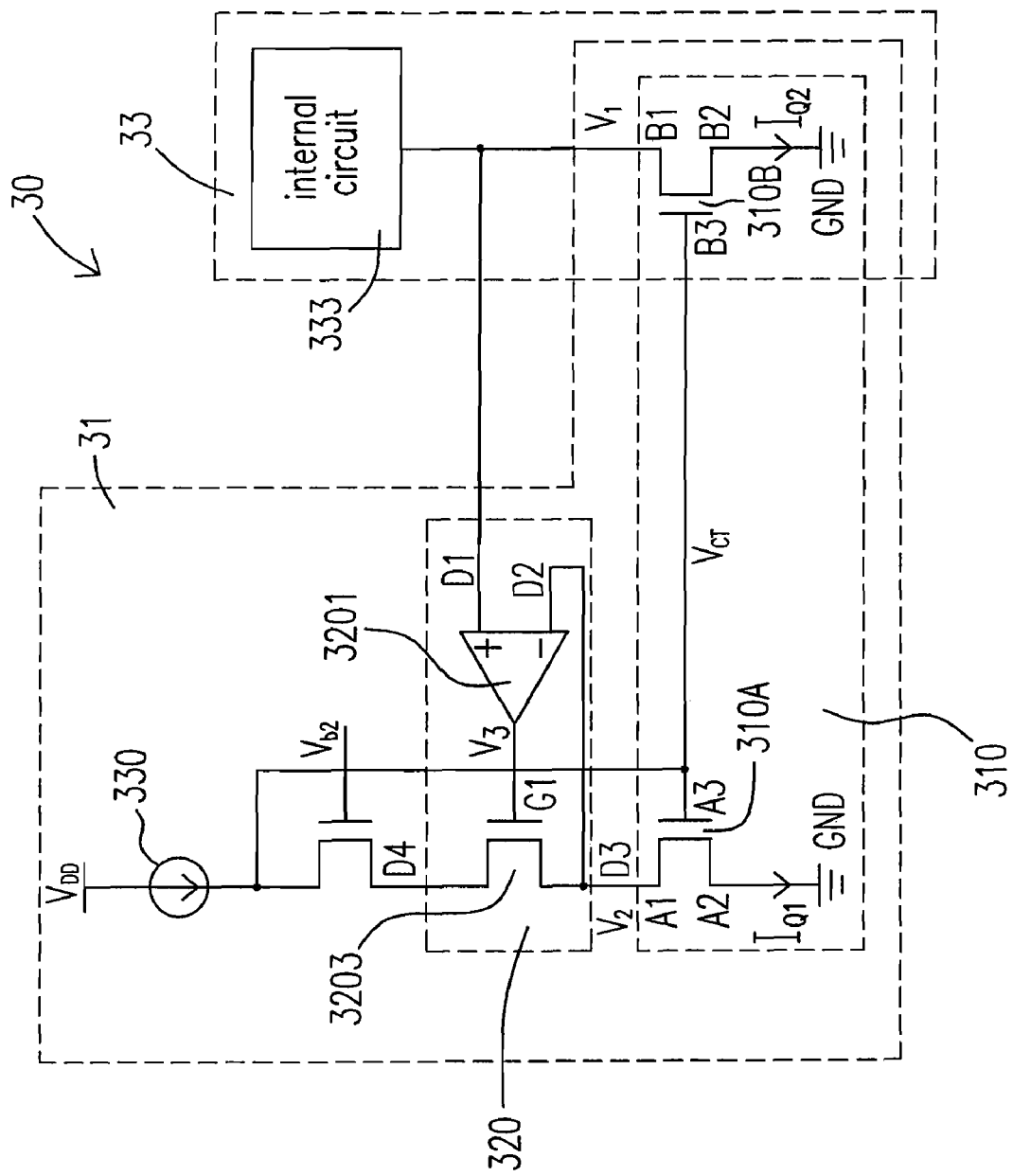
FIG. 3 is a diagram showing a current output circuit according to the present invention.

Please refer to FIG. 3, showing a current output circuit according to the present invention. A circuit 30 comprises a current output circuit 31 and a first circuit 33, wherein an internal circuit 333 of the first circuit 33 receives a second current $I_{Q2}$ from the current output circuit 31.

In this embodiment, the current output circuit 31 comprises a current mirror circuit 310, a feedback control circuit 320 and a reference current source 330 for providing a reference current $I_{Q1}$. The current mirror circuit 310 comprises a first transistor 310A and a second transistor 310B, wherein a terminal A1 with a second potential $V_2$ of the first transistor 310A is coupled to the feedback control circuit 320 and a terminal A2 of the first transistor 310A is coupled to the lower operational voltage (ex: GND), and a control terminal A3 of the first transistor 310A receives a control potential $V_{CT}$ for causing the current flowing through the first transistor 310A to be the reference current $I_{Q1}$. Because of the current mirror structure of the first transistor 310A and the second transistor 310B, the current flowing through the second transistor 310B will be a second current $I_{Q2}$ proportioned to the reference current $I_{Q1}$. In other words, it is related to the aspect ratio of the first transistor 310A and the second transistor 310B. In an embodiment, The feedback control circuit 320 comprises a comparison circuit 3201 and a third transistor 3203, and is coupled between the reference current source 330 and the current mirror circuit 310. The comparison circuit 3201 comprises a first terminal D1, a second terminal D2 and an output terminal. The first terminal D1 is coupled to the drain B1 with a first potential $V_1$ of the second transistor 310B. The second terminal D2 is coupled to the drain A1 with the second potential $V_2$ of the first transistor 310A, and a third potential $V_3$ is generated at the output terminal of the comparison circuit 3201. The third transistor 3203 comprises a third terminal D3 coupled to the terminal A1 of the first transistor 310A and a fourth terminal D4 coupled to the reference current source 330. The gate G1 of the third transistor 3203 is coupled to the output terminal of the comparison circuit 3201 and receives the third potential $V_3$, so that the first potential $V_1$ substantially equals to the second potential $V_2$. Furthermore, the first circuit 33 can be any circuit requiring a reference current $I_{Q2}$ provided by the second transistor 310B, or it can comprise the second transistor 310B to receive the second current $I_{Q2}$. Besides, the first circuit 33 can further comprise a fourth transistor (not shown in FIG. 3), wherein a gate of the fourth transistor receives the control potential $V_{CT}$ and form another current mirror circuit with the first transistor 310A.

Figure 4:
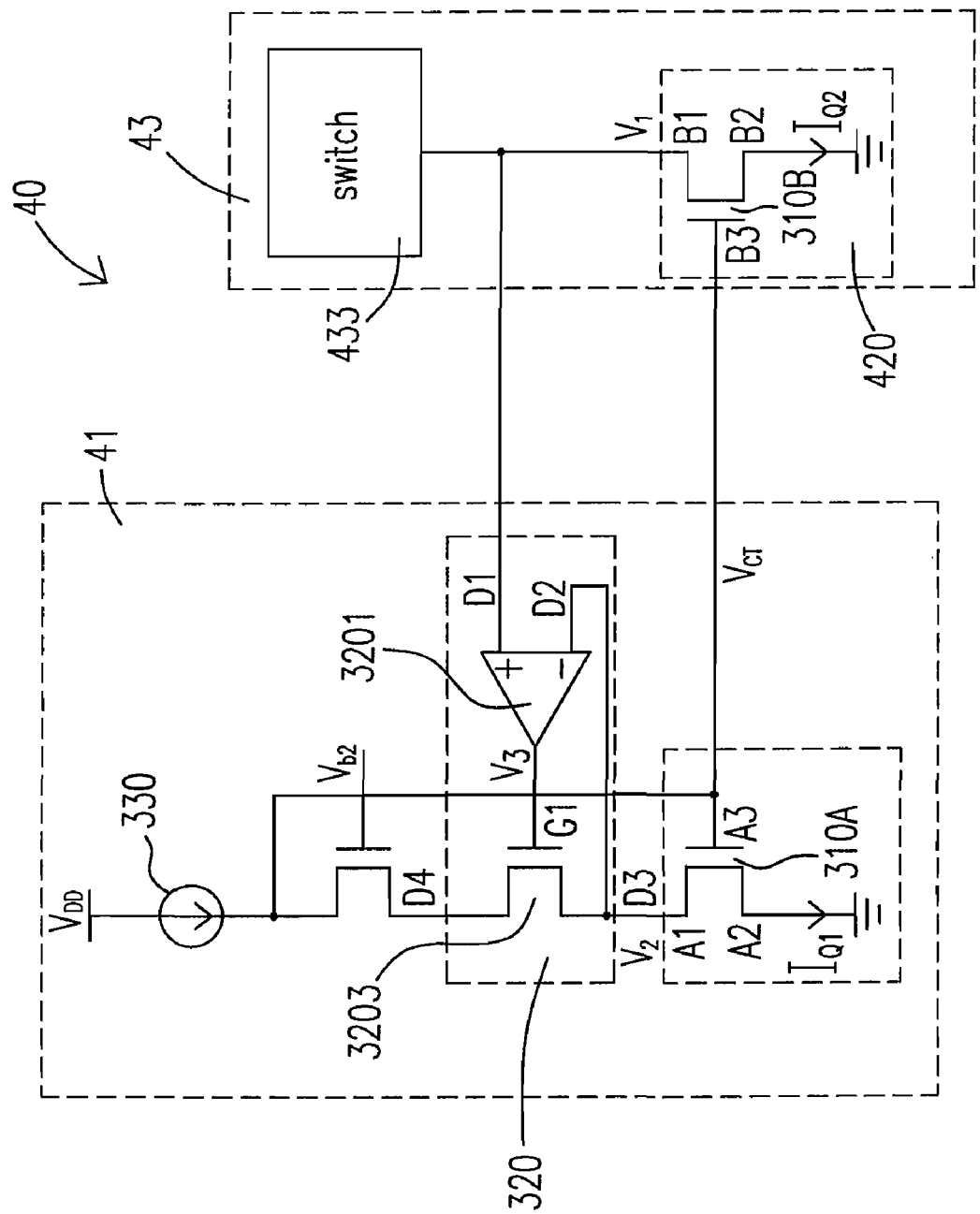
FIG. 4 is a diagram showing a bias outputting circuit applicable to a DAC according to the present invention.

Please refer to FIG. 4, showing a bias outputting circuit according to the present invention applicable to the first circuit 33. The DAC 40 comprises a bias outputting circuit 41 according to the present invention and a DAC unit 43. In this embodiment, the DAC unit 43 comprises a switch 433 and a current source 420 implemented by a transistor 310B. The bias outputting circuit 41 comprises a first transistor 310A, a feedback control circuit 320 and a reference current source 330, wherein the first transistor 310A of the bias outputting circuit 41 and the transistor 310B of the DAC unit 43 form a current mirror circuit. Furthermore, in FIG. 3 and FIG. 4, there is an omissible transistor coupled between the reference current source 330 and the third transistor 3203.

Figure 5:
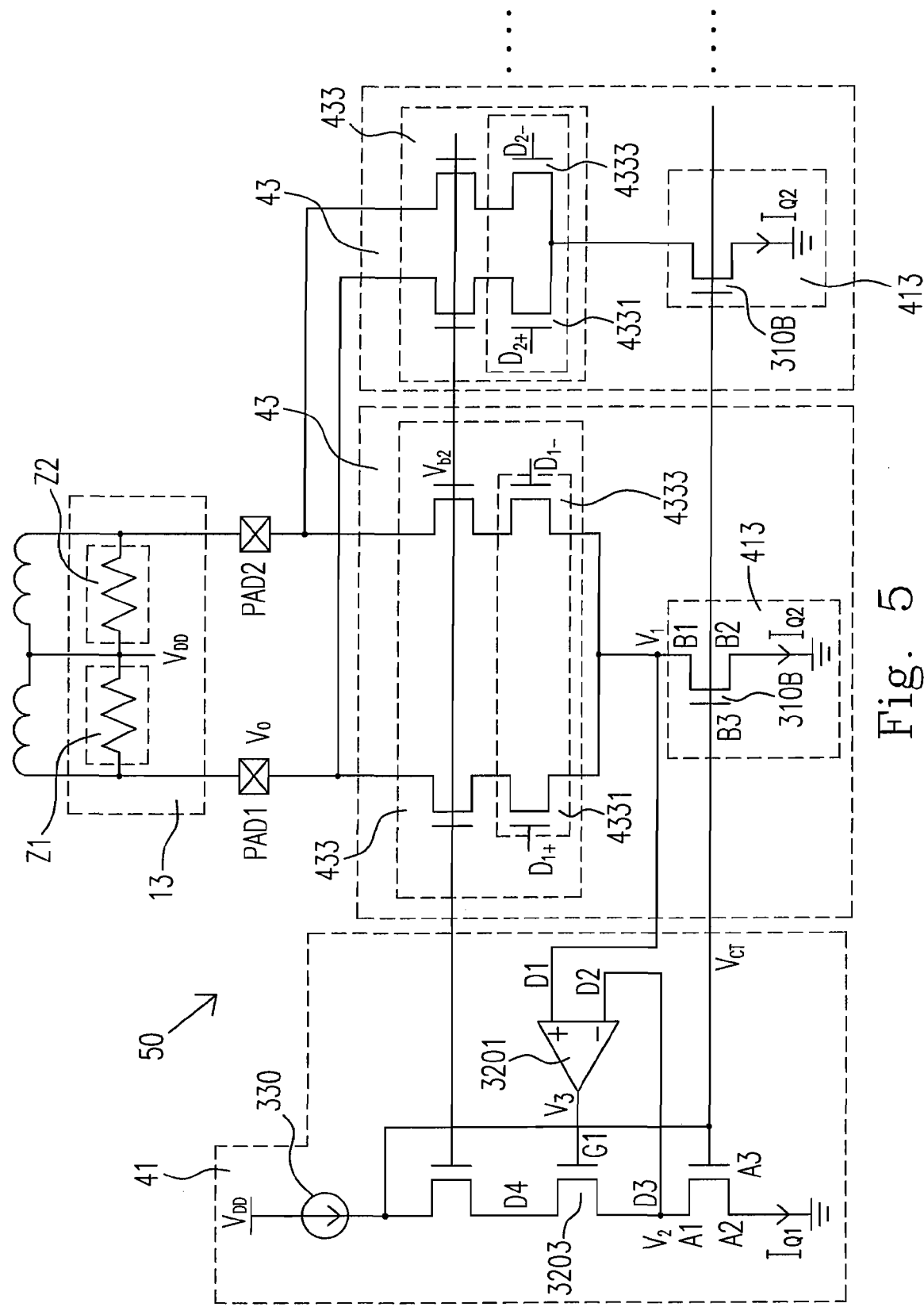
FIG. 5 is a diagram showing the present invention applicable to a Current Steering DAC.

Please refer to FIG. 5, which is a diagram showing the present invention applicable to a DAC. The DAC 50 comprises the bias outputting circuit 41 according to the present invention and a plurality of DAC units 43. Each DAC unit 43 comprises a switch 433 and a current source 413, wherein an embodiment of the current source 413 is a transistor 310B. Each current source 413 receives a control voltage $V_{CT}$ and outputs a current according to the control voltage $V_{CT}$.

In this embodiment, the switch 433 of each DAC unit 43 receives corresponding digital signals, i.e. the respective $D_{1+}$ and $D_{1-}$ ($D_{2+}$ and $D_{2-}$, $D_{n+}$ and $D_{n-}$) for converting the digital signals to current signals. Each current signal is summed up to form an analog outputting signal outputted at PAD1 and PAD2. In FIG. 5, there are a plurality of transistors coupled between a transistor 4331 and the PAD1 as well as between a transistor 4333 and the PAD2, for increasing the performance of the DAC unit 43. Furthermore, there is a transistor coupled between the reference current source 330 and the third transistor 3203, which is added for the transistors coupled between the transistor 4331 and the PAD1 as well as between the transistor 4333 and the PAD2. The above-mentioned transistors are all omissible.

Please refer to FIGS. 3-5, wherein the output terminal of the comparison circuit 3201 of the feedback control circuit 320 outputs the third potential $V_3$ by comparing the first terminal D1 with the second terminal D2 thereof. The transistor 3203 receives the third potential $V_3$ to make the drain-source voltage ($V_{DS}$) of the second transistor 310B be adjusted the same as the drain-source voltage ($V_{DS}$) of the first transistor 310A, thereby causing the second current $I_{Q2}$ to substantially correspond to the reference current $I_{Q1}$.

It is to be understood that the invention need not be limited to the disclosed embodiment. On the contrary, it is intended to cover various modifications and similar arrangements included within the spirit and scope of the appended claims, which are to be accorded with the broadest interpretation so as to encompass all such modifications and similar structures.

What is claimed is:

1. A circuit comprising:
   a current mirror circuit comprising a first transistor and a second transistor having respectively two drains;
   a control circuit coupled to the current mirror circuit, receiving drain voltages of the first transistor and the second transistor, and adjusting a respective gate bias of the first transistor and the second transistor according to a respective drain voltage thereof, wherein the control circuit comprises a comparison circuit having a first comparison input connected to the drain of the first transistor, the comparison circuit having a second comparison input connected to the drain of the second transistor;
   a third transistor having a gate connected to an output of the comparison circuit and series connected with the first transistor; and
   a reference current source series connected to the first and third transistors such that the drain of the first transistor receives the reference current, the reference current source also being directly connected to the gate of the first transistor.

2. The circuit of claim 1, wherein the second transistor is disposed in a digital to analog converter.

3. The circuit of claim 1, wherein the control circuit is a feedback control circuit.

4. The circuit of claim 1, wherein the third transistor is configured to adjust the drain voltage of the first transistor.

5. An apparatus comprising:
a converter comprising an output node and a plurality of converting units, wherein each of the converting units comprising:
   a controlled current sourcing unit to receive a control voltage and to provide a controlled current according to the control voltage; and
   a switch, coupled to the controlled current sourcing unit, to provide the controlled current to the output node according to a digital signal; and
a control circuit, coupled to the converter, to monitor a potential of the controlled current sourcing unit and thereby produce the control voltage, wherein the control circuit comprises:
a comparison circuit comparing drain voltages of a first transistor and a second transistor; and
a third transistor channel connected to the first transistor, and having a gate coupled to an output of the comparison circuit for adjusting the drain voltage of the first transistor; and
a reference current source series connected to the first and third transistors of the control circuit for providing a reference current, wherein the drain of the first transistor receives the reference current, and the drain of the second transistor generates an output current corresponding to the reference current.

6. The apparatus of claim 5, wherein the converter is a digital to analog converter.

7. The apparatus of claim 5, wherein the control circuit is a feedback control circuit.

8. A current outputting method comprising:
providing a reference current through a first transistor;
using a current mirror circuit comprising the first transistor and a second transistor to output an output current, wherein the output current corresponds to the reference current;
comparing a drain voltage of the first transistor with a drain voltage of the second transistor for obtaining a first comparison result;
using the comparison result to drive a gate of a third transistor that is channel connected to the first transistor and also series connected to the reference current; and
adjusting a respective gate potential of the first transistor and the second transistor according to the first comparison result.

9. The method of claim 8, wherein the second transistor is disposed in a digital to analog converter.

* * * * *